(12) United States Patent
de Jager (10) Patent No.: US 7,081,944 B2
(45) Date of Patent: Jul. 25, 2006

(54) LITHOGRAPHIC PROJECTION APPARATUS AND DEVICE MANUFACTURING METHOD UTILIZING TWO ARRAYS OF FOCUSING ELEMENTS

(75) Inventor: Pieter Willem Herman de Jager, Rotterdam (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 11/288,134

(22) Filed: Nov. 29, 2005

(65) Prior Publication Data
US 2006/0072093 A1   Apr. 6, 2006

Related U.S. Application Data

(63) Continuation of application No. 10/740,836, filed on Dec. 22, 2003.

(51) Int. Cl.
G03B 27/42 (2006.01)
G03B 27/53 (2006.01)

(52) U.S. Cl. ............ 355/52; 355/53; 355/67; 355/71; 250/492.2; 250/548; 430/311; 359/204; 359/291; 359/572

(58) Field of Classification Search ............. None
See application file for complete search history.

(56) References Cited

U.S. PATENT DOCUMENTS

| 5,500,736 A | 3/1996 | Koitabashi et al. |
|---|---|---|
| 5,523,193 A | 6/1996 | Nelson |
| 5,530,482 A | 6/1996 | Gove et al. |
| 5,579,147 A | 11/1996 | Mori et al. |
| 5,677,703 A | 10/1997 | Bhuva et al. |
| 5,808,797 A | 9/1998 | Bloom et al. |
| 5,982,553 A | 11/1999 | Bloom et al. |
| 6,133,986 A | 10/2000 | Johnson |
| 6,177,980 B1 | 1/2001 | Johnson |
| 6,214,633 B1 | 4/2001 | Clark et al. |
| 6,424,404 B1 | 7/2002 | Johnson |
| 6,687,041 B1 | 2/2004 | Sandstrom |
| 6,747,783 B1 | 6/2004 | Sandstrom |
| 6,795,169 B1 | 9/2004 | Tanaka et al. |

(Continued)

FOREIGN PATENT DOCUMENTS

EP       0 881 542 A1      12/1998

(Continued)

OTHER PUBLICATIONS

European Search Report from European Patent Application No. 04257818.7, 6 pages, dated May 18, 2005.

*Primary Examiner*—D. Rutledge
(74) *Attorney, Agent, or Firm*—Sterne, Kessler, Goldstein & Fox P.L.L.C.

(57) ABSTRACT

A system and method is used to pattern a substrate. A projection beam received from a radiation system is patterned using an array of individually controllable elements. A portion of the projection beam is directed directly onto one of the individually controllable elements and collecting radiation reflected therefrom using each one of a first array of focusing elements. An image of the first array of focusing elements is projected onto a second array of focusing elements using a projection system, such that radiation reflected from one of the individually controllable elements is projected via one of the focusing elements in the first array of focusing elements and the projection system to one of the focusing elements in the second array which focuses the radiation onto a spot on the substrate.

14 Claims, 3 Drawing Sheets

U.S. PATENT DOCUMENTS

| | | |
|---|---|---|
| 6,806,897 B1 | 10/2004 | Kataoka et al. |
| 6,811,953 B1 | 11/2004 | Hatada et al. |
| 2001/0028495 A1 | 10/2001 | Quate et al. |
| 2002/0097495 A1 | 7/2002 | Mei |
| 2002/0191894 A1 | 12/2002 | Culver et al. |
| 2003/0123040 A1 | 7/2003 | Almogy |
| 2004/0041104 A1 | 3/2004 | Liebregts et al. |
| 2004/0042213 A1 | 3/2004 | Kimura et al. |
| 2004/0130561 A1 | 7/2004 | Jain |
| 2005/0134819 A1 | 6/2005 | de Jager |

FOREIGN PATENT DOCUMENTS

| | | |
|---|---|---|
| EP | 1 372 036 A1 | 12/2003 |
| EP | 1 482 375 A2 | 12/2004 |

LITHOGRAPHIC PROJECTION APPARATUS AND DEVICE MANUFACTURING METHOD UTILIZING TWO ARRAYS OF FOCUSING ELEMENTS

CROSS REFERENCE TO RELATED APPLICATIONS

This application is a continuation of U.S. application Ser. No. 10/740,836, filed Dec. 22, 2003, which is incorporated by reference herein in its entirety.

BACKGROUND OF THE INVENTION

1. Field of the Invention

The present invention relates to a lithographic projection apparatus.

2. Related Art

Lithographic projection apparatus are used in the manufacture of integrated circuits (ICs), flat panel displays (FPDs), and other devices involving fine structures. An array of individually controllable elements generates a pattern corresponding to an individual layer of, for example, the IC, and this pattern is imaged onto a target portion (e.g., comprising part of one or several dies) on a substrate (e.g., a silicon wafer, glass plate, or the like) that has been coated with a layer of radiation-sensitive material (e.g., resist).

Prior to this imaging step, the substrate may undergo various procedures, such as priming, resist coating, and a soft bake. After exposure, the substrate may be subjected to other procedures, such as a post-exposure bake (PEB), development, a hard bake, and measurement/inspection of the imaged features. These transfer procedures result in a patterned layer of resist on the substrate. One or more pattern steps, such as deposition, etching, ion-implantation (doping), metallization, oxidation, chemo-mechanical polishing, etc., follow, each of which is intended to finish, create or modify a layer of the device. If several layers are required, then the whole procedure, or a variant thereof, is repeated for each new layer. Eventually, an array of devices will be present on the substrate. These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4, which is incorporated herein by reference.

In many cases, the packing density of the individually controllable elements within an array of individually controllable elements may be relatively low (i.e., the active area of each element that can modulate the beam of radiation is a relatively small fraction of the total area of the element). Therefore a significant proportion of the radiation within the radiation beam cannot be modulated. In other words, this radiation is either reflected by the array of individually controllable elements or absorbed by the array of individually controllable elements, regardless of the pattern set on the array.

It has previously been proposed to include a micro lens array within the radiation system in order to provide a projection beam that is made up of a plurality of spots; and then to project this beam onto the active areas of the array of individually controllable elements. However, projecting such a projection beam of radiation onto the array of individually controllable elements and subsequently projecting the patterned beam onto the substrate requires a complex and consequently expensive projection system.

Therefore, what is needed is a way of illuminating only active areas of an array of individually controllable elements without requiring a complex projection system.

SUMMARY OF THE INVENTION

An embodiment of the present invention provides a lithographic projection apparatus including a radiation system for providing a projection beam of radiation, an array of individually controllable elements for patterning the projection beam according to a desired pattern, and a substrate table for holding a substrate. The apparatus also includes first and second arrays of focusing elements and a projection system. Each focusing element in the first array can be used to direct a portion of the projection beam directly onto one of the individually controllable elements and collect radiation reflected from it. The projection system can be used to project an image of the first array of focusing elements onto the second array of focusing elements. The second array can be arranged such that radiation reflected from one of the individually controllable elements is projected via one of the focusing elements in the first array of focusing elements and the projection system to one of the focusing elements in the second array, which focuses the radiation onto a spot on the substrate.

Another embodiment of the present invention provides a method for manufacturing a device. The method includes at least the following steps. Patterning a projection beam received from a radiation system using an array of individually controllable elements to pattern. Directing a portion of the projection beam directly onto one of the individually controllable elements and collecting radiation reflected therefrom using each one of a first array of focusing elements. Projecting an image of the first array of focusing elements onto a second array of focusing elements using a projection system, such that radiation reflected from one of the individually controllable elements is projected via one of the focusing elements in the first array of focusing elements and the projection system to one of the focusing elements in the second array, which, in turn, focuses the radiation onto a spot on the substrate.

A further embodiment of the present invention provides a method for manufacturing a device including at least the following steps. Providing a substrate. Providing a projection beam of radiation using a radiation system. Using an array of individually controllable elements to pattern the projection beam. Using a first array of focusing elements, each for directing a portion of the projection beam directly onto one of the individually controllable elements and collecting radiation reflected therefrom. Using a projection system to project an image of the first array of focusing elements onto a second array of focusing elements, the second array being arranged such that radiation reflected from one of the individually controllable elements is projected via one of the focusing elements in the first array of focusing elements and the projection system to one of the focusing elements in the second array which focuses the radiation onto a spot on the substrate.

In these embodiments, the projection optics used to project the beam onto the first array of focusing elements and the requirements of the projection system to project the patterned beam onto the second array of focusing elements can be the same as would be used if the array of individually controllable elements were to be uniformly exposed and projected onto the substrate. However, the first array of focusing elements can still focus a portion of the radiation beam onto each of the individually controllable elements, thereby allowing a greater proportion of the radiation beam to be modulated.

The first array of focusing elements can be arranged adjacent to the array of individually controllable elements and is uniformly illuminated. The first array of focusing elements may be an array of micro lenses, each micro lens being used to focus a portion of the radiation beam onto one of the individually controllable elements, in particular onto the active part of the the individually controllable element. In this fashion, the first array of focusing elements is the final element in the path of the radiation before it is incident on the array of individually controllable elements.

Each of the individually controllable elements can be a diffractive optical micro-electro-mechanics (MEMS) device. Each element of such a device can be arranged in at least two settings: in the first, the active surface acts as a plane reflector, reflecting zero-order radiation back into the corresponding one of the focusing elements; in the second setting, its active surface forms a grating, diffracting first order radiation away from the corresponding one of the focusing elements.

The projection system may be arranged to project an image of the array of focusing elements onto the second array of focusing elements. For example, the projection system may be arranged such that zero-order radiation reflected from one of the individually controllable elements is projected via the corresponding one of the focusing elements in the first array through the projection system and onto a corresponding one of the focusing elements in the second array. The corresponding focusing element in the second array focuses the radiation onto a spot on the substrate. In one embodiment, the second array of focusing elements can be an array of micro lenses.

The array of individually controllable elements may be mounted on one side of a substrate and the first array of focusing elements may also be mounted on the substrate so as to form a gas-tight enclosure around the individually controllable elements. Alternatively, a plate that is substantially transmissive to the projection beam of radiation may be mounted on the substrate so as to form a gas-tight enclosure around the individually controllable elements. The first array of focusing elements may also be mounted within the gas-tight enclosure.

The gas-tight enclosure surrounding the individually controllable elements may be evacuated or may be filled with a substantially clean and pure gas. If the gas-tight enclosure is filled with such a gas, the apparatus may include a gas inlet for connection between the gas-tight enclosure and a source of the gas and a gas outlet from the enclosure such that the gas can be flushed through the enclosure, removing any impurities and/or contaminants.

An actuator may be provided for adjusting the position of the first array of focusing elements relative to the array of individually controllable elements to ensure that the radiation is properly focused on each of the individually controllable elements. The first array of focusing elements may also include actuators for adjusting the positions of each of the focusing elements relative to one another in order to ensure that the radiation is accurately focused onto the active part of each of the individually controllable elements.

Further embodiments, features, and advantages of the present inventions, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

The present invention will now be described with reference to the accompanying drawings. In the drawings, like reference numbers may indicate identical or functionally similar elements. Additionally, the left-most digit(s) of a reference number may identify the drawing in which the reference number first appears.

DETAILED DESCRIPTION OF THE INVENTION

Overview and Terminology

The term "array of individually controllable elements" as here employed should be broadly interpreted as referring to any device that can be used to endow an incoming radiation beam with a patterned cross-section, so that a desired pattern can be created in a target portion of the substrate; the terms "light valve" and "Spatial Light Modulator" (SLM) can also be used in this context. Examples of such patterning device include:

A programmable mirror array, which may comprise a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate spatial filter, the the undiffracted light can be filtered out of the reflected beam, leaving only the diffracted light to reach the substrate; in this manner, the beam becomes patterned according to the addressing pattern of the matrix-addressable surface. An array of diffractive optical MEMS devices can also be used in a corresponding manner. Each diffractive optical MEMS device is comprised of a plurality of reflective ribbons that can be deformed relative to one another to form a grating that reflects incident light as diffracted light. A further alternative embodiment of a programmable mirror array employs a matrix arrangement of tiny mirrors, each of which can be individually tilted about an axis by applying a suitable localized electric field, or by employing piezoelectric actuation device. Once again, the mirrors are matrix-addressable, such that addressed mirrors will reflect an incoming radiation beam in a different direction to unaddressed mirrors; in this manner, the reflected beam is patterned according to the addressing pattern of the matrix-addressable mirrors. The required matrix addressing can be performed using suitable electronic device. In both of the situations described hereabove, the array of individually controllable elements can comprise one or more programmable mirror arrays.

More information on mirror arrays as here referred to can be gleaned, for example, from U.S. Pat. Nos. 5,296,891 and 5,523,193, and PCT patent applications WO 98/38597 and WO 98/33096, which are all incorporated by reference herein in their entireties.

It should be appreciated that where pre-biasing of features, optical proximity correction features, phase variation techniques and multiple exposure techniques are used, the pattern "displayed" on the array of individually controllable elements may differ substantially from the pattern eventually transferred to a layer of or on the substrate.

For the sake of simplicity, the projection system may be referred to as the "lens"; however, this term should be broadly interpreted as encompassing various types of projection system, including refractive optics, reflective optics, catadioptric systems and micro lens arrays, for example.

It is to be understood that the term "projection system" as used in this application simply refers to any system for transferring the patterned beam from the array of individually controllable elements to the substrate.

The radiation system may also include components operating according to any of these design types for directing, shaping or controlling the projection beam of radiation, and such components may also be referred to below, collectively or singularly, as a "lens".

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g., water, so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems.

Although specific reference may be made in this text to the use of The system of the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, thin film transistor liquid crystal displays, printed circuit boards (PCBs), etc.

In the present document, the terms "radiation" and "beam" are used to encompass all types of electromagnetic radiation, including ultraviolet radiation (e.g., with a wavelength of 436, 405, 365, 248, 193, 157 or 126 nm) and EUV (extreme ultra-violet radiation, e.g., having a wavelength in the range 5–20 nm), as well as particle beams, such as ion beams or electron beams.

Lithographic Projection Apparatus

Figure 1:
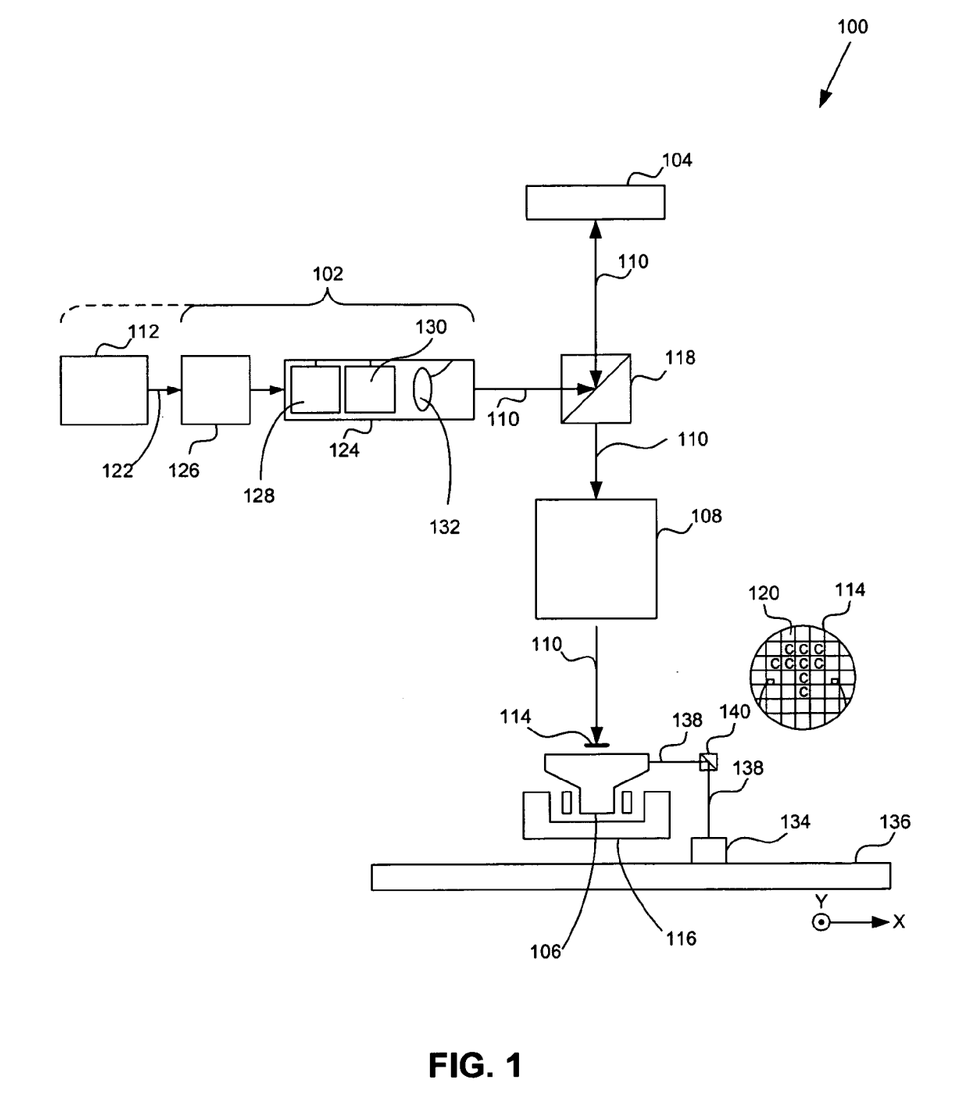
FIG. 1 depicts a lithographic projection apparatus according to an embodiment of the invention.

FIG. 1 schematically depicts a lithographic projection apparatus 100 according to an embodiment of the invention. Apparatus 100 includes at least a radiation system 102 (e.g., EX, IL (e.g., AM, IN, CO, etc.) etc.), an array of individually controllable elements PPM 104, an object table WT 106 (e.g., a substrate table), and a projection system ("lens") PL 108.

Radiation system 102 can be used for supplying a projection beam PB 110 of radiation (e.g., UV radiation), which in this particular case also comprises a radiation source LA 112.

Array of individually controllable elements 104 (e.g., a programmable mirror array) can be used for applying a pattern to the projection beam 110. In general, the position of the array of individually controllable elements 104 can be fixed relative to projection system 108. However, in an alternative arrangement, array of individually controllable elements 104 may be connected to a positioning device (not shown) for accurately positioning it with respect to projection system 108. As here depicted, individually controllable elements 104 is of a reflective type (e.g., has a reflective array of individually controllable elements).

Object table 106 can be provided with a substrate holder (not specifically shown) for holding a substrate W 114 (e.g., a resist-coated silicon wafer or glass substrate) and object table 106 can be connected to positioning device PW 116 for accurately positioning substrate 114 with respect to projection system 108.

Projection system (e.g., a lens) 108 (e.g., a quartz and/or $CaF_2$ lens system or a catadioptric system comprising lens elements made from such materials, or a mirror system) can be used for projecting the patterned beam received from beam splitter 118 onto a target portion C 120 (e.g., one or more dies) of the substrate 114. The projection system 108 may project an image of the array of individually controllable elements 104 onto the substrate 114. Alternatively, the projection system 108 may project images of secondary sources for which the elements of the array of individually controllable elements 104 act as shutters. The projection system 108 may also comprise a micro lens array (MLA) to form the secondary sources and to project microspots onto the substrate 114.

The source 112 (e.g., an excimer laser) can produce a beam of radiation 122. This beam 122 is fed into an illumination system (illuminator) IL 124, either directly or after having traversed conditioning device 126, such as a beam expander Ex, for example. The illuminator 124 may comprise adjusting device AM 128 for setting the outer and/or inner radial extent (commonly referred to as σ-outer and σ-inner, respectively) of the intensity distribution in the beam 122. In addition, it will generally comprise various other components, such as an integrator IN 130 and a condenser CO 132. In this way, the beam 110 impinging on the array of individually controllable elements 104 has a desired uniformity and intensity distribution in its cross-section.

It should be noted, with regard to FIG. 1, that the source 112 may be within the housing of the lithographic projection apparatus 100 (as is often the case when the source 112 is a mercury lamp, for example). In alternative embodiments, source 112 may also be remote from the lithographic projection apparatus 100. In this case, radiation beam 122 would be led into the apparatus 100 (e.g., with the aid of suitable directing mirrors). This latter scenario is often the case when the source 112 is an excimer laser. It is to be appreciated that both of these scenarios are contemplated within the scope of the present invention.

The beam 110 subsequently intercepts the array of individually controllable elements 104 after being directing using beam splitter 118. Having been reflected by the array of individually controllable elements 104, the beam 110 passes through the projection system 108, which focuses the beam 110 onto a target portion 120 of the substrate 114.

With the aid of the positioning device 116 (and optionally interferometric measuring device IF 134 on base plate BP 136 that receives interferometric beams 138 via beam splitter 140), the substrate table 106 can be moved accurately, so as to position different target portions 120 in the path of the beam 110. Where used, the positioning device for the array of individually controllable elements 104 can be used to accurately correct the position of the array of individually controllable elements 104 with respect to the path of the beam 110, e.g., during a scan. In general, movement of the object table 106 is realized with the aid of a long-stroke module (course positioning) and a short-stroke module (fine positioning), which are not explicitly depicted in FIG. 1. A similar system may also be used to position the array of individually controllable elements 104. It will be appreciated that the projection beam 110 may alternatively/additionally be moveable while the object table 106 and/or the array of individually controllable elements 104 may have a fixed position to provide the required relative movement.

In an alternative configuration of the embodiment, the substrate table 106 may be fixed, with the substrate 114 being moveable over the substrate table 106. Where this is done, the substrate table 106 is provided with a multitude of openings on a flat uppermost surface, gas being fed through the openings to provide a gas cushion which is capable of supporting the substrate 114. This is conventionally referred to as an air bearing arrangement. The substrate 114 is moved over the substrate table 106 using one or more actuators (not shown), which are capable of accurately positioning the substrate 114 with respect to the path of the beam 110. Alternatively, the substrate 114 may be moved over the substrate table 106 by selectively starting and stopping the passage of gas through the openings.

Although the lithography apparatus 100 according to the invention is herein described as being for exposing a resist on a substrate, it will be appreciated that the invention is not limited to this use and the apparatus 100 may be used to project a patterned projection beam 110 for use in resistless lithography.

The depicted apparatus 100 can be used in four preferred modes:

1. Step mode: the entire pattern on the array of individually controllable elements 104 is projected in one go (i.e., a single "flash") onto a target portion 120. The substrate table 106 is then moved in the x and/or y directions to a different position for a different target portion 120 to be irradiated by the beam 110.
2. Scan mode: essentially the same as step mode, except that a given target portion 120 is not exposed in a single "flash." Instead, the array of individually controllable elements 104 is movable in a given direction (the so-called "scan direction", e.g., the y direction) with a speed v, so that the projection beam 110 is caused to scan over the array of individually controllable elements 104. Concurrently, the substrate table 106 is simultaneously moved in the same or opposite direction at a speed V=Mv, in which M is the magnification of the projection system 108. In this manner, a relatively large target portion 120 can be exposed, without having to compromise on resolution.
3. Pulse mode: the array of individually controllable elements 104 is kept essentially stationary and the entire pattern is projected onto a target portion 120 of the substrate 114 using a pulsed radiation system 102. The substrate table 106 is moved with an essentially constant speed such that the projection beam 110 is caused to scan a line across the substrate 106. The pattern on the array of individually controllable elements 104 is updated as required between pulses of the radiation system 102 and the pulses are timed such that successive target portions 120 are exposed at the required locations on the substrate 114. Consequently, the projection beam 110 can scan across the substrate 114 to expose the complete pattern for a strip of the substrate 114. The process is repeated until the complete substrate 114 has been exposed line by line.
4. Continuous scan mode: essentially the same as pulse mode except that a substantially constant radiation system 102 is used and the pattern on the array of individually controllable elements 104 is updated as the projection beam 110 scans across the substrate 114 and exposes it.

Combinations and/or variations on the above described modes of use or entirely different modes of use may also be employed.

Figure 2:
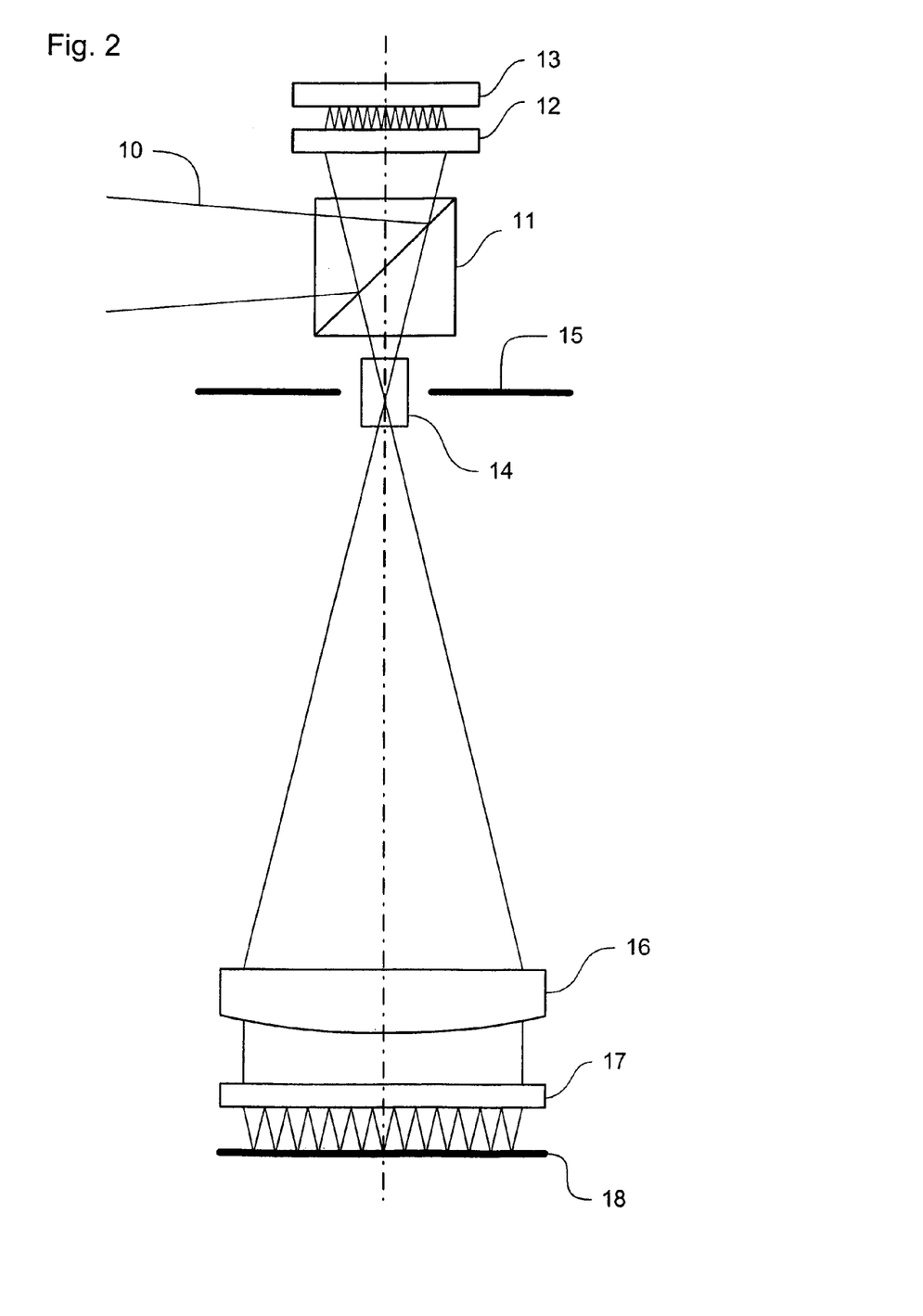
FIG. 2 depicts a schematic arrangement for illuminating the array of individually controllable elements and for projecting the patterned beam onto the substrate.

An arrangement for illuminating the array of individually controllable elements in order to pattern the projection beam of radiation is shown in FIG. 2. The projection beam 10 of radiation from the radiation system is projected onto an array of focusing elements 12 by means of a beam splitter 11. It will be appreciated that an alternative arrangement could be used to project the radiation onto the array of focusing elements. For example, the radiation may be projected at a slightly non-telecentric angle. Preferably, the array of focusing elements is a micro lens array. Again, however, an alternative arrangement may be used if required, for example a Fresnel lens or a zone plate lens. Each of the elements within the array of focusing elements 12 directly focuses a portion of the projection beam 10 onto one of the individually controllable elements within the array of individually controllable elements 13. Preferably, the array of focusing elements 12 is arranged such that the radiation is focused onto only the active areas of the individually controllable elements. Therefore, all of the radiation is directed onto parts of the array of individually controllable elements 13 that can be used to modulate radiation, even if the individually controllable elements 13 are loosely packed, for example due to the requirements to provide control for each of the individually controllable elements 13.

With continuing reference to FIG. 2, the radiation reflected from the array of individually controllable elements 13 returns through the array of focusing elements 12, passes through the beam splitter 11 and then through the projection lens 14. The patterned beam, in this arrangement, is then incident on a field lens 16. Field lens 16 directs the patterned beam onto a second array of focusing elements 17, which focuses the radiation onto substrate 18. In this manner, the first array of focusing elements 12 is imaged onto the second array of focusing elements 17.

It will be appreciated that an alternative arrangement to that shown and described may be used to image the first array of focusing elements 12 onto the second array of focusing elements 17. Preferably, the second array of focusing elements 17 is a micro lens array (although, as before, other devices that achieve a similar effect may also be used). It will be understood that the relationship between pitch of the first and second arrays of focusing elements 12 and 17 will be determined by the magnification of the system imaging the first array onto the second array 17.

In the preferred arrangement, schematically shown in FIG. 2, each individually controllable element within the array of individually controllable elements 13 has an associated focusing element in the array of focusing elements 12. This focusing element focuses radiation from a portion of the projection beam 10 onto the active part of the individually controllable element and collects the radiation reflected from it. This reflected radiation is then projected by the projection system 14 and the field lens 16 onto a corresponding one of the focusing elements in the second array of focusing elements 17. This latter focusing element then focuses that portion of the patterned beam onto a spot on the substrate 18. As described, each of the individually controllable elements in the array of individually controllable elements 13 is associated with one of the focusing elements in each of the first and second arrays of focusing elements 12, 17. Therefore, the projection beam can simply be uniformly illuminated onto the first array of focusing elements 12 and the first array of focusing elements 12 need only be simply imaged onto the second array of focusing elements 17. Therefore, the projection optics are relatively simple.

Preferably, the array of individually controllable elements 13 is comprised of an array of diffractive optical MEMS devices. Each of the diffractive optical MEMS devices is comprised of a reflective surface or surfaces which can be arranged in at least two states.

In the first state, the diffractive optical MEMS device is a plane reflector and radiation focused onto it by a focusing element in the first array of focusing elements 12 is simply reflected (i.e., zero-order reflection). This reflected radiation is collected by the associated focusing element in the array of focusing elements 12 and projected through the projection lens 14 and the field lens 16 onto one of the focusing elements in the second array of focusing elements 17 as described above. The latter focusing element focuses the radiation onto a spot on the substrate 18.

When the diffractive optical MEMS device is in the second state, it forms a grating. This may be achieved by the diffractive optical MEMS device being comprised of a plurality of ribbon-like reflectors which can be actuated such that every other ribbon is displaced in a direction perpendicular to the surface of the reflective surfaces. Alternatively the reflective surface may be continuous, but displaced from its planar shape, for example, into a sinusoid. Regardless of the manner in which it is achieved, the diffractive optical MEMS device in this second state behaves as a grating for the portion of the radiation beam that is focused onto it by the focusing element within the array of focusing elements 12. Consequently, due to diffraction, the radiation from the diffractive optical MEMS device is first order diffracted radiation and does not reflect directly back into the associated one of the focusing elements in the array of focusing elements 12. Instead, it may be directed into one of the neighboring focusing elements in the array of focusing elements 12 and will therefore leave the array of focusing elements at a large angle. This radiation is blocked in the pupil 15 of the projection optics, and therefore does not reach the second array of focusing elements 17 and is not focused onto the substrate 18. By contrast, as described above, the radiation that is focused onto diffractive optical MEMS devices in the first state is reflected in zero-order and is substantially parallel to the optical axis of the apparatus. It therefore passes through the pupil 15 and is focused onto the substrate 18 by one of the focusing elements in the second array of focusing elements 17. Consequently, only radiation associated with diffractive optical MEMS devices in the first state is projected onto the substrate 18, thereby producing the required pattern.

Figure 3:
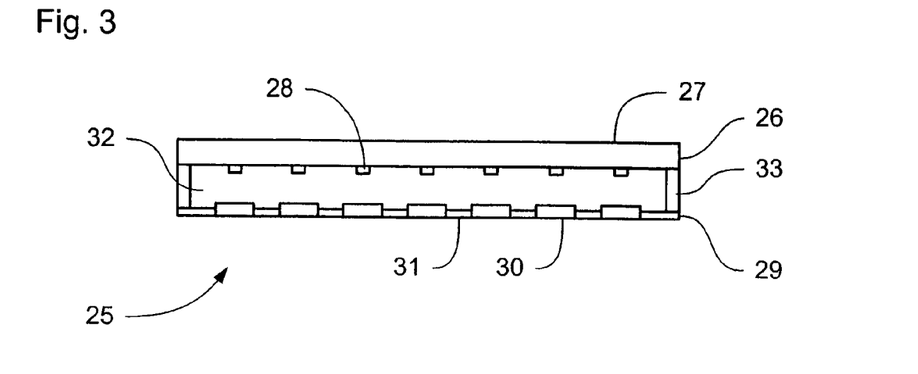
FIG. 3 depicts an arrangement of the array of individually controllable elements, suitable for use in the present invention.

The individually controllable elements in the first array of individually controllable elements 13 may be enclosed within a housing in order to protect them from contamination by gases that may cause damage to them or by contaminant particles that may interfere with their operation. FIG. 3 shows such a device 25.

In FIG. 3, an array of individually controllable elements 26 is comprised of a substrate 27 with the individually controllable elements 28 mounted on one side of the substrate 27. The array of focusing elements 29 consists of focusing elements 30, such as micro-lenses mounted within a support 31. The array of focusing elements 29 is mounted on the array of individually controllable elements to form a gas-tight enclosure 32. As shown, this may be achieved by means of mounting walls 33. It will be appreciated, however, that these elements may be replaced by protrusions from the substrate 27 of the array of individually controllable elements and/or by protrusions from the support 31 of the array of focusing elements. In any case, the components may be bonded together by means of eutectic bonding or other known precision bonding techniques. In this manner, the array of focusing elements 29 is used as one side of the gas-tight enclosure.

Figure 4:
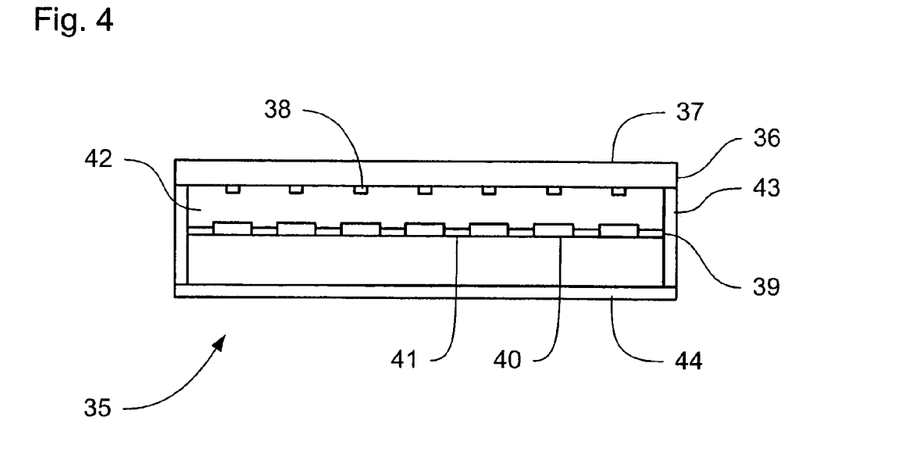
FIG. 4 depicts and alternative arrangement to that shown in FIG. 3.

FIG. 4 shows and alternative arrangement of such a device 35 in which the gas-tight enclosure 42 is formed by the combination of substrate 37 (on which the individually controllable elements 38 of the array of individually controllable elements 36 are mounted), side walls 43 and a plate 44 of material that is substantially transmissive to the radiation used. The array of focusing elements 39, made up of focusing elements 40 and a support 41, as before, is mounted within the gas-tight enclosure 42. As before, the side walls may be part of the substrate or the radiation transmissive plate.

Figure 5:
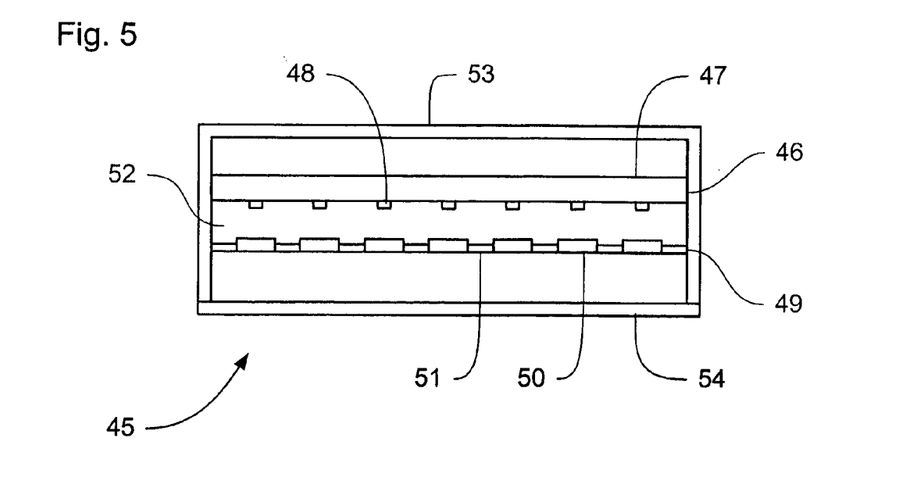
FIG. 5 shows a further variant of devices shown in FIG. 3 and FIG. 4.

FIG. 5 shows a further variant of the devices 25, 35 shown in FIG. 3 and FIG. 4. In this case, the wall 53 is extended such that the gas-tight enclosure is formed from the wall 53 and the radiation transmissive plate 54. The array of individually controllable elements 46 and the array of focusing elements 49 are separately mounted within the gas-tight enclosure.

The gas-tight enclosure may be evacuated, preferably below 100 mTorr, or may be filled with a substantially pure, clean gas (e.g., Nitrogen, Argon, or other inert gases). If required, the gas-tight enclosure may be flushed with the gas. For example there may be a gas inlet and gas outlet connected to the gas-tight enclosure. The gas inlet can then be connected a source of clean gas in order to flush the gas-tight enclosure ensuring that the contaminant levels are kept low even if the gas-tight enclosure is not perfect, allowing a small ingress of contaminants, or if contaminants are generated within the gas-tight enclosure.

In order to ensure correct alignment of the focusing elements 30, 40, 50 with the corresponding individually controllable elements 28, 38, 48, actuators may be provided to adjust the position of the array of focusing elements 29, 39, 49 relative to the array of individually controllable elements 26, 36, 46. Additionally or alternatively, a plurality of actuators may be provided for adjusting the position of the focusing elements 30, 40, 50 relative to one another. The actuators used may be piezo-electric actuators, especially in the case of actuators for adjusting the position of the focusing elements 30, 40, 50 relative to one another or may be lorentz actuators, especially in the case of adjusting the position of the array of focusing elements 29, 39, 49 relative to the array of individually controllable elements 26, 36, 46. It will be appreciated that other, well-known, devices for accurately controlling position may also be used, for example, thermo-electronic actuation or acoustic modulation.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. A system, comprising:
    an illumination system that conditions a beam of radiation;
    an array of individually controllable elements that pattern the beam;
    a projection system that projects that patterned beam onto an image plane; and
    first and second arrays of focusing elements,
    wherein each focusing element in the first array of focusing elements directs a portion of the beam onto a corresponding one of the individually controllable elements and directs a portion of the patterned beam onto a corresponding focusing element in the second array of focusing elements, which focuses the portion of the patterned beam onto a spot in the image plane.

2. The system of claim 1, wherein the portion of the beam directed onto each of the individually controllable elements by the first array of focusing elements is focused onto an active part of the individually controllable element.

3. The system of claim 1, wherein the first array of focusing elements comprises:
    one of an array of micro lenses, a Fresnel lens, and a zone plate lens,
    wherein each element in the one of the array of micro lenses, the Fresnel lens, and the zone plate directs the portion of the beam onto the corresponding one of the individually controllable elements and directs the portion of the patterned beam onto the corresponding focusing element in the second array of focusing elements.

4. The system of claim 1, wherein the first array of focusing elements is a final element in a path of the beam before it is incident on the array of individually controllable elements.

5. The system of claims 1, wherein each of the individually controllable elements is a diffractive optical MEMS device, whereby at a first setting an active surface of the MEMS device acts as a plane reflector reflecting zero order radiation back into the corresponding one of the focusing elements in the first array of focusing elements and at a second setting the active surface of the MEMS device forms a grating that diffracts first order radiation away from the one of the corresponding focusing elements in the first array of focusing elements.

6. The system of claim 1, wherein the second array of focusing elements comprises one of an array of micro lenses, a Fresnel lens, and a zone plate.

7. The apparatus according claim 1, wherein the array of individually controllable elements and the first array of focusing elements are at least one of located in or positioned to form a gas tight enclosure.

8. The system of claim 7, wherein the gas tight enclosure is substantially evacuated.

9. The system of claim 7, wherein the gas tight enclosure is evacuated to less than about 100 mTorr.

10. The system of claim 7, wherein the gas tight enclosure is filled with a substantially pure and clean gas.

11. The system of claim 10, further comprising:
    a gas inlet coupled between the enclosure and a source of the gas; and
    a gas outlet coupled to the enclosure that permits the gas to be flushed through the enclosure.

12. The system of claim 1, further comprising:
    an actuator that adjusts a position of the first array of focusing elements relative to the array of individually controllable elements.

13. The system of claim 1, further comprising:
    actuators that adjust positions of each focusing elements within the first array of focusing elements relative to one another.

14. A method, comprising:
    patterning a beam of radiation using an array of individually controllable elements;
    directing a portion of the beam onto corresponding ones of the individually controllable elements using respective focusing elements in a first array of focusing elements;
    directing a portion of the pattered beam onto corresponding focusing elements in a second array of focusing elements using respective focusing elements in the first array of focusing elements; and
    focusing the patterned radiation as corresponding focus spots in an image plane using respective focusing elements in the second array of focusing elements.

* * * * *